United States Patent
Evans et al.

(10) Patent No.: US 9,276,159 B2
(45) Date of Patent: Mar. 1, 2016

(54) SUPERLATTICE STRUCTURE

(71) Applicant: TELEDYNE SCIENTIFIC & IMAGING, LLC, Thousand Oaks, CA (US)

(72) Inventors: Allan Evans, Woodland Hills, CA (US); William Tennant, Thousand Oaks, CA (US); Andrew Hood, Ventura, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 117 days.

(21) Appl. No.: 13/725,349

(22) Filed: Dec. 21, 2012

(65) Prior Publication Data

US 2015/0303344 A1    Oct. 22, 2015

(51) Int. Cl.
| | | |
|---|---|---|
| *H01L 29/06* | (2006.01) | |
| *H01L 31/00* | (2006.01) | |
| *H01L 31/109* | (2006.01) | |
| *H01L 31/0352* | (2006.01) | |
| *H01L 31/0304* | (2006.01) | |

(52) U.S. Cl.
CPC ........ *H01L 31/109* (2013.01); *H01L 31/03046* (2013.01); *H01L 31/035236* (2013.01)

(58) Field of Classification Search
USPC ............... 257/10, 13, 18, 28, 293, 15; 438/93
See application file for complete search history.

(56) References Cited

U.S. PATENT DOCUMENTS

| | | | |
|---|---|---|---|
| 6,407,407 B1 | 6/2002 | Johnson et al. | ........ 257/18 |
| 7,682,865 B2 | 3/2010 | Razeghi | ........ 438/93 |
| 7,692,183 B2 | 4/2010 | Razeghi | ........ 257/28 |
| 2002/0030720 A1 | 3/2002 | Kawamura et al. | ........ 257/188 |
| 2007/0090337 A1* | 4/2007 | Ueno et al. | ........ 257/13 |

OTHER PUBLICATIONS

A.J. Evans et al., Strained Layer Superlattice (SLS) Materials for High Operating Temperature MWIR Dectors, Feb. 2011, pp. 1-14.
C. Grein et al., "Optimization of MWIR type-II superlattices for infrared detection", *Proc. SPIE* 7660, Infrared Technology and Applications XXXVI. 76601L (May 3, 2010), pp. 1-5.
A.J. Evans et al., MWIR Strained Layer Superlattice (SLS) Detector Materials for Persistent Surveillance, Feb. 2010, pp. 1-14.

* cited by examiner

*Primary Examiner* — Errol Fernandes
(74) *Attorney, Agent, or Firm* — Koppel, Patrick, Heybl & Philpott

(57) ABSTRACT

A structure comprised of an InAsSb layer adjacent to a GaSb layer, with the adjacent InAsSb and GaSb layers repeating to form a superlattice (SL). The structure is preferably an unstrained SL, wherein the composition of the InAsSb layer is $InAs_{0.91}Sb_{0.09}$; the $InAs_{0.91}Sb_{0.09}$ layers are preferably lattice-matched to the GaSb layers. The SL structure is preferably arranged such that the Sb component of the InAsSb layers reduces the strain in the SL structure so that it is less than that found in an InAs/GaSb Type-II Strained Layer Superlattice (SLS). The present SL structure is suitably employed as part of an infrared photodetector.

10 Claims, 3 Drawing Sheets

SUPERLATTICE STRUCTURE

GOVERNMENT RIGHTS

This invention was made with Government support under Air Force contract FA9453-09-C-0329 awarded by the United States Air Force. The Government has certain rights in this invention.

FIELD OF THE INVENTION

This invention is directed to superlattice structures, and more particularly to superlattice structures used for infrared photodetectors.

BACKGROUND

Infrared (IR) photodetectors have found widespread application in IR thermal imaging systems. Traditionally, the most sensitive IR detectors have been made with mercury-cadmium-telluride (HgCdTe) alloy. However, HgCdTe materials have been refined to the point where they are extremely pure and device performance is now limited by the fundamental properties of the electronic band structure of the HgCdTe crystal, which cannot be improved further. Furthermore, the size of cadmium-zinc-telluride (CdZnTe) substrates, on which the HgCdTe is grown, has been outpaced by other substrate materials, such as GaAs, InP, GaSb, and Silicon, which are available in larger sizes. The current CdZnTe substrate size limits the number of HgCdTe infrared detector devices which can be fabricated on a single wafer, which in turn prevents HgCdTe-based infrared detectors from benefitting from the economy of scale seen with larger substrates that can accommodate more devices. Additionally, the wafer size limits the ultimate size of large arrays, which would consume an entire wafer. In the very long IR wavelengths, HgCdTe-based detectors have exhibited problems with (i) compositional variations across the wafer which cause variations of the band gap, (ii) large tunneling dark currents caused by the narrow band gap (<0.1 eV), and (iii) higher defect-related dark currents.

The emergence of thin film growth techniques such as molecular beam epitaxy (MBE) and metal organic chemical vapor deposition (MOCVD) has allowed the synthesization of a wide range of multiple quantum well (MQW) and superlattice (SL) engineered materials. Such artificial structures are currently of great interest as they afford the possibility of tailoring the electronic structure of the crystal by controlled modification of the crystal: viz., layer thickness, alloy composition, strain, growth orientation, etc. Of particular note, the growth of thin strained layer superlattices (SLSs) using Group III-V materials has opened up new materials for IR detection which can be engineered to be superior to other state-of-the-art materials. Detectors based on such SLSs can be readily manufactured at lower costs compared to HgCdTe, with the same or better performance, owing to their compatibility with advanced III-V device processing technology currently in place to support the diode laser and transistor industries—a commonality and economy-of-scale II-VI-based HgCdTe do not benefit from.

One common SLS detector configuration makes use of binary/binary InAs/GaAs materials. These detectors are known to suffer from an as-yet unidentified defect that reduces carrier lifetime and causes recombination of light-generated carriers before they can be collected and measured at a terminal of the device. These detectors also tend to have higher dark currents than most state of the art "W" type ("W-SLs") or ternary type SLs. In addition, adjusting the strain requires that the interface between layers must be forced, thereby putting all the strain at the interfaces.

A W-SL—e.g., an InAs/GaInSb/InAs/quinternary such as InAs/$Ga_{0.80}In_{0.20}$Sb/InAs/$Al_{0.10}In_{0.28}Ga_{0.62}As_{0.37}Sb_{0.63}$—might also be used as an IR detector. However, one of the drawbacks of this type of W-SL structure is that the light hole subband may exist too close to the valence maximum.

SUMMARY OF THE INVENTION

A superlattice (SL) structure is presented which overcomes some of the problems noted above, providing lower dark currents and being easier to grow than other structures.

The present SL structure comprises a InAsSb layer adjacent to a GaSb layer, with the adjacent InAsSb and GaSb layers repeating to form a SL structure. The structure is preferably an unstrained SL structure, wherein the composition of the InAsSb layer is $InAs_{0.91}Sb_{0.09}$.

The $InAs_{0.91}Sb_{0.09}$ layers are preferably lattice-matched to the GaSb layers. The thicknesses of the layers are preferably 4 Monolayers $InAs_{0.91}Sb_{0.09}$ and 10 Monolayers GaSb, and the $InAs_{0.91}Sb_{0.09}$ layers and the GaSb layers preferably have approximately the same lattice constant. The SL structure is preferably arranged such that the Sb component of the InAsSb layers reduces the strain in the SL structure so that it is less than that found in an InAs/GaSb Type-II Strained Layer Superlattice (SLS). The present SL structure is suitably employed as part of an infrared photodetector.

These and other features, aspects, and advantages of the present invention will become better understood with reference to the following description and claims.

DETAILED DESCRIPTION OF THE INVENTION

The present SL structure is suitably employed as part of an IR detector, though other applications might include, for example, superlattice-based photodetectors, SL semiconductor lasers, thermoelectric power generators, or thermoelectric coolers.

The SL structure comprises:
a layer comprising InAsSb; and
a layer comprising GaSb adjacent to the InAsSb layer;
with the adjacent InAsSb and GaSb layers repeating to form a superlattice structure.

Figure 1A:
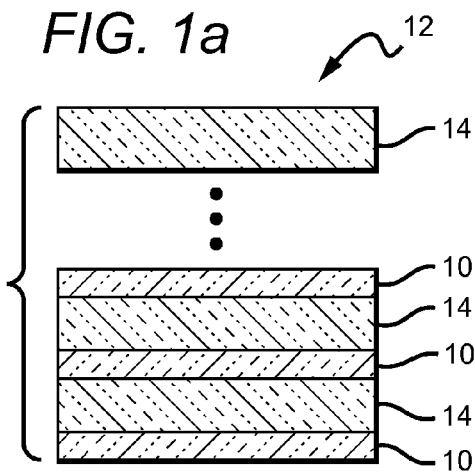
FIG. 1a is a sectional view of one possible embodiment of a SL structure in accordance with the present invention.

One possible embodiment of this structure is illustrated in FIG. 1a. Here, the bottommost layer 10 of a superlattice structure 12 is an InAsSb layer, and the layer immediately adjacent is a GaSb layer 14. The layers are repeated in this way (GaSb layer 14 on InAsSb layer 10) as needed to form superlattice structure 12.

Superlattices are typically formed using molecular beam epitaxy (MBE). Atoms of a layer's materials are introduced onto a crystal surface and bond with other atoms to form a first crystal layer having an associated atomic spacing related to the starting layer, the atomic diameter of the material deposited, and the strain of that material. A second layer is formed on the first layer using this same MBE process, but with different materials. Each layer is typically several atoms thick and additional first and second layers are stacked atop the first two layers to form a superlattice. This method of forming a semiconductor structure is particularly advantageous when fabricating photodetectors. Building the layers atom-by-atom enables the relationship between device materials and the resulting crystal properties which control band gap, absorption coefficient, electrical mobility, and carrier lifetime to be well-understood and predictable; as such, the performance characteristics of a detector can be more easily engineered and manufactured.

However, because the semiconductor material is different, the atomic spacing of the second crystal lattice layer is typically also different than that of the first. This can result in the atoms of the first layer being poorly aligned with those of the second layer, such that one layer must be stretched or compressed to achieve alignment, or "lattice matching". However, this stretching or compressing of a layer increases the strain on the layer, which tends to introduce defects and dislocations which can degrade the performance of the SL structure as an IR detector by increasing noise relative to the detected signal.

This stretching or compressing of a layer is known to occur with a binary/binary InAs/GaSb SL structure. The present SL structure mitigates this problem by replacing the InAs layers with InAsSb layers: the addition of large Sb atoms to the layer serves to improve the alignment between the InAsSb layers and the adjacent GaSb layers, and to make the structure an unstrained SL.

The composition of the SL structure's InAsSb layers is preferably $InAs_{0.91}Sb_{0.09}$. Substituting $InAs_{0.91}Sb_{0.09}$ for InAs in an InAs/GaSb superlattice provides better lattice spacing and thus less net strain, thereby introducing fewer dark current-increasing defects into the crystal. Instead, the present SL structure leads to Auger-limited performance free of defect-limited noise currents, improving minority carrier lifetimes and lowering dark currents than a traditional binary GaSb/InAs Type II Strained Layer Superlattice (SLS). Some mild strain may still be present, but would be spread throughout the layers rather than concentrated at the interface between layers. Reducing or eliminating strain in this way further simplifies the engineering of the device, with the amount of strain becoming more predictable.

The present SL structure has a higher vertical mobility than do W-SLs, its intrinsic recombination and optical properties are similar to those of W-SLs, and it is easier to grow than a comparable W-SL. The present structure could potentially be used to provide IR detectors that perform better than conventional HgCdTe detectors, while also having a higher operating temperature.

The InAsSb (preferably $InAs_{0.91}Sb_{0.09}$) layers of the present SL structure are preferably lattice-matched to the GaSb layers.

The thicknesses of the preferred SL structure's layers are preferably as follows:
  4 Monolayers (ML) (1.22 nm) $InAs_{0.91}Sb_{0.09}$; and
  10 ML (3.05 nm) GaSb.

Figure 1B:
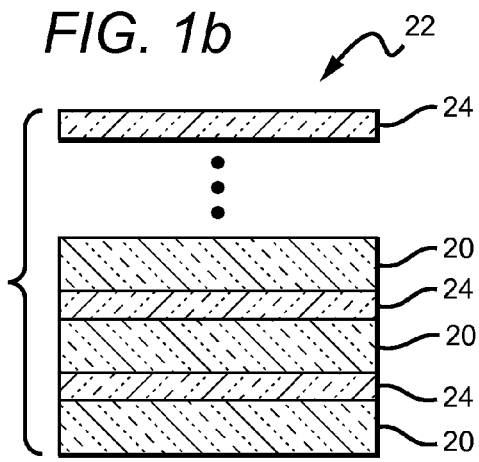
FIG. 1b is a sectional view of another possible embodiment of a SL structure in accordance with the present invention.

FIG. 1a depicts a structure in which each GaSb layer is on an InAsSb layer. The present SL structure can also be arranged as shown in FIG. 1b. Here, the first layer 20 of SL structure 22 made from GaSb, and an InAsSb layer 24 is on first layer 20; these layers repeat to form SL structure 22. As before, the InAsSb layer is preferably $InAs_{0.91}Sb_{0.09}$, and the preferred layer thicknesses are 4 ML for $InAs_{0.91}Sb_{0.09}$ layers 24 and 10 ML for GaSb layers 20.

Figure 2A:
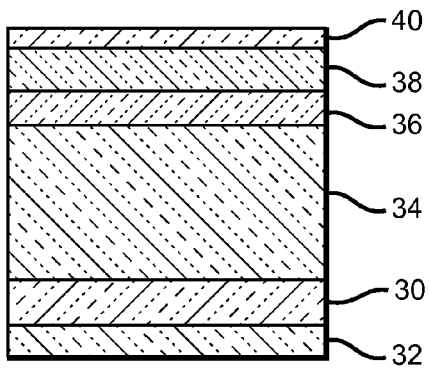
FIG. 2a is a sectional view of one possible embodiment of a portion of an infrared photodetector which might include a SL structure in accordance with the present invention.

The present SL structure is suitable employed as a portion of an IR photodetector. One possible embodiment is shown in FIG. 2a, which depicts a double heterostructure, with an MWIR Absorber—i.e., an absorber layer with a MWIR bandgap—capped by wider bandgap cap layers. In the exemplary embodiment shown, a P-type SLS electrical contact 30 is on a GaSb buffer substrate layer 32, and an SLS Absorber layer 34 as described herein is on contact 30. A P-type SLS contact 36, an N-type SLS electrical contact 38 and a cap layer 40 on SLS Absorber layer 34 complete the device. A heterostructure is formed where two different superlattices meet. Thus, in FIG. 2a, a 'top' heterostructure is formed between SLS Absorber layer 34 and wider bandgap layer (and P-type SLS contact) 36, and a 'bottom' heterostructure is formed between layer 34 and wider bandgap layer (and P-type SLS electrical contact) 30. Due to its distance from the high electric field region that forms around the n/p junction between layers 36 and 38, the bottom heterostructure is not as critical to device operation as the top one. However, the bottom heterostructure should still be carefully engineered, because an incorrectly engineered bottom heterostructure can lead to reduced quantum efficiency and unintended carrier recombination.

Figure 2B:
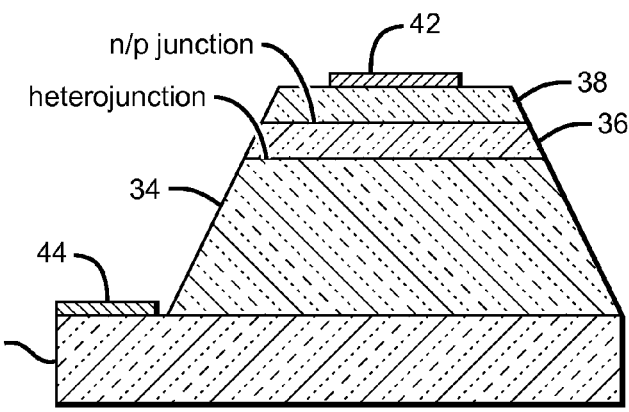
FIGS. 2b and 2c are sectional diagrams of possible embodiments of infrared photodetectors which might include a SL structure in accordance with the present invention.
Figure 2C:
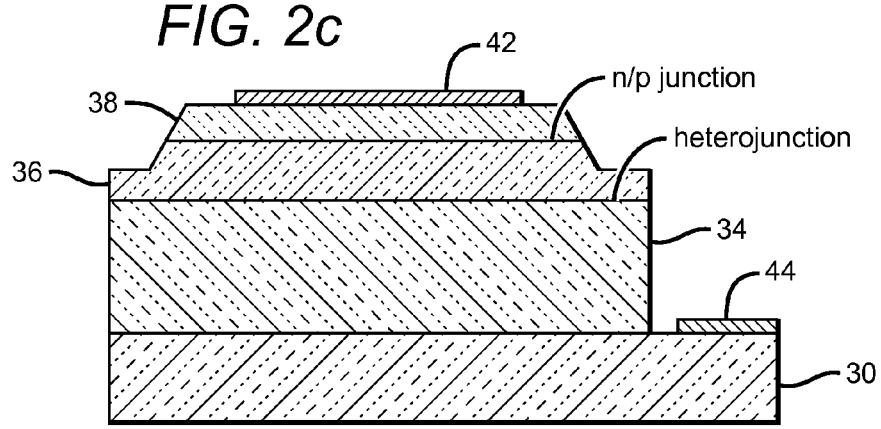

Processed device embodiments with deep- and shallow-etched mesas, which serve to isolate the individual pixels, are shown in FIGS. 2b and 2c, respectively. These device figures include contacts 42 and 44, which contact cap layer 40 (not labeled in FIGS. 2b and 2c) and layer 30 (within the processed device architecture), respectively.

The heterojunctions where two superlattices meet are preferably graded; i.e. arranged such that there is a gradual transition of bandgap from one superlattice to another. For example, the bandgap of layer 34 is different than the bandgap of the other layers in FIG. 2A; i.e., it is smaller than the bandgaps of layers 36 and 30. To facilitate transport of carriers across the n/p junction, the bandgap of layer 34 can be graded—i.e., slowly transitioning from small to large over the last ~0.5 to 1 micron of layer 34—until it equals the bandgap of layer 36. This may be implemented by, for example, changing the period and composition of the superlattice in layer 34 until it equals the superlattice in layer 36.

Figure 3:
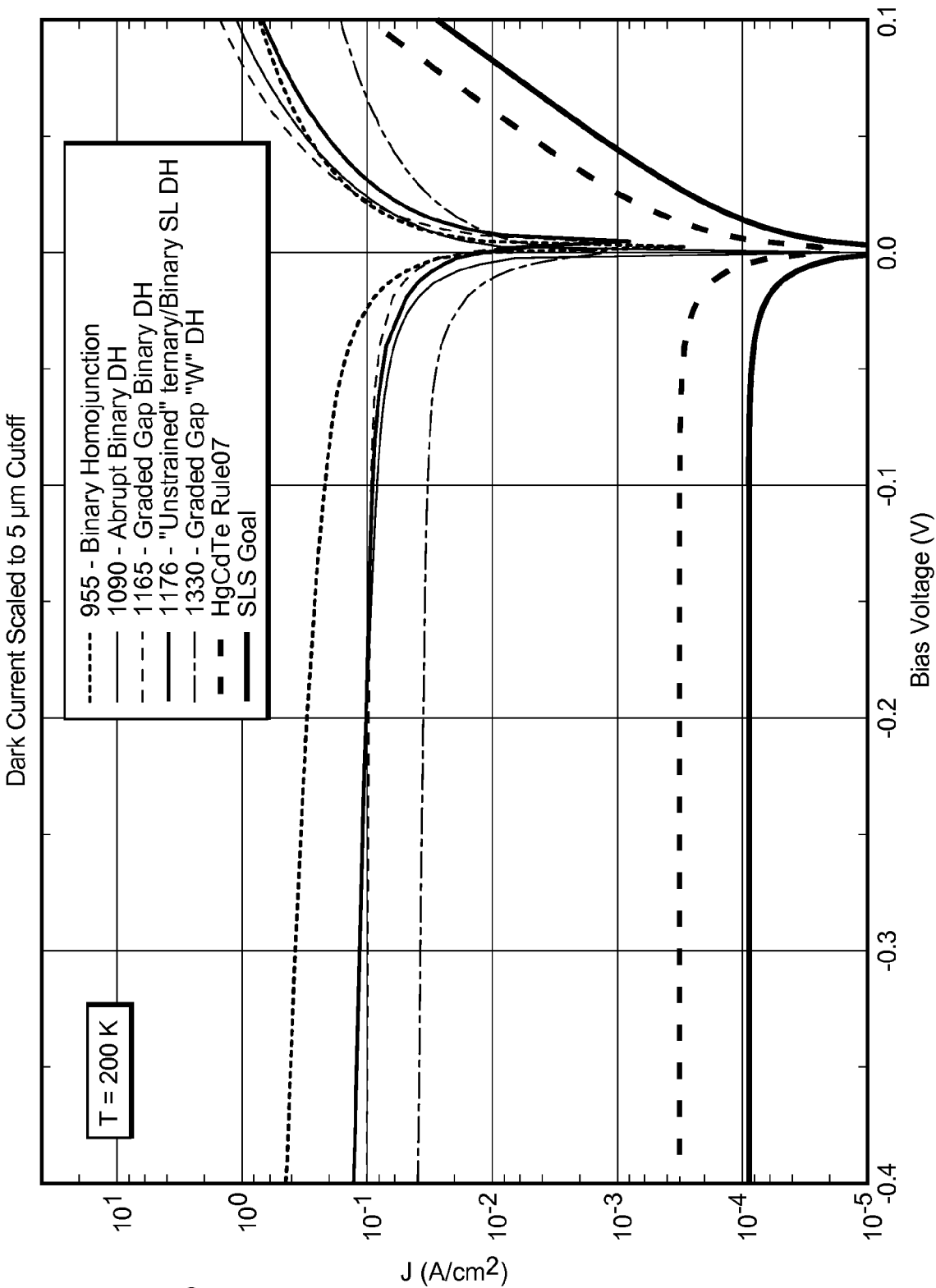
FIG. 3 is a graph showing current-voltage (I-V) curves measured at a temperature of 200 K for various MWIR detector designs employing SL structures.
Figure 4:
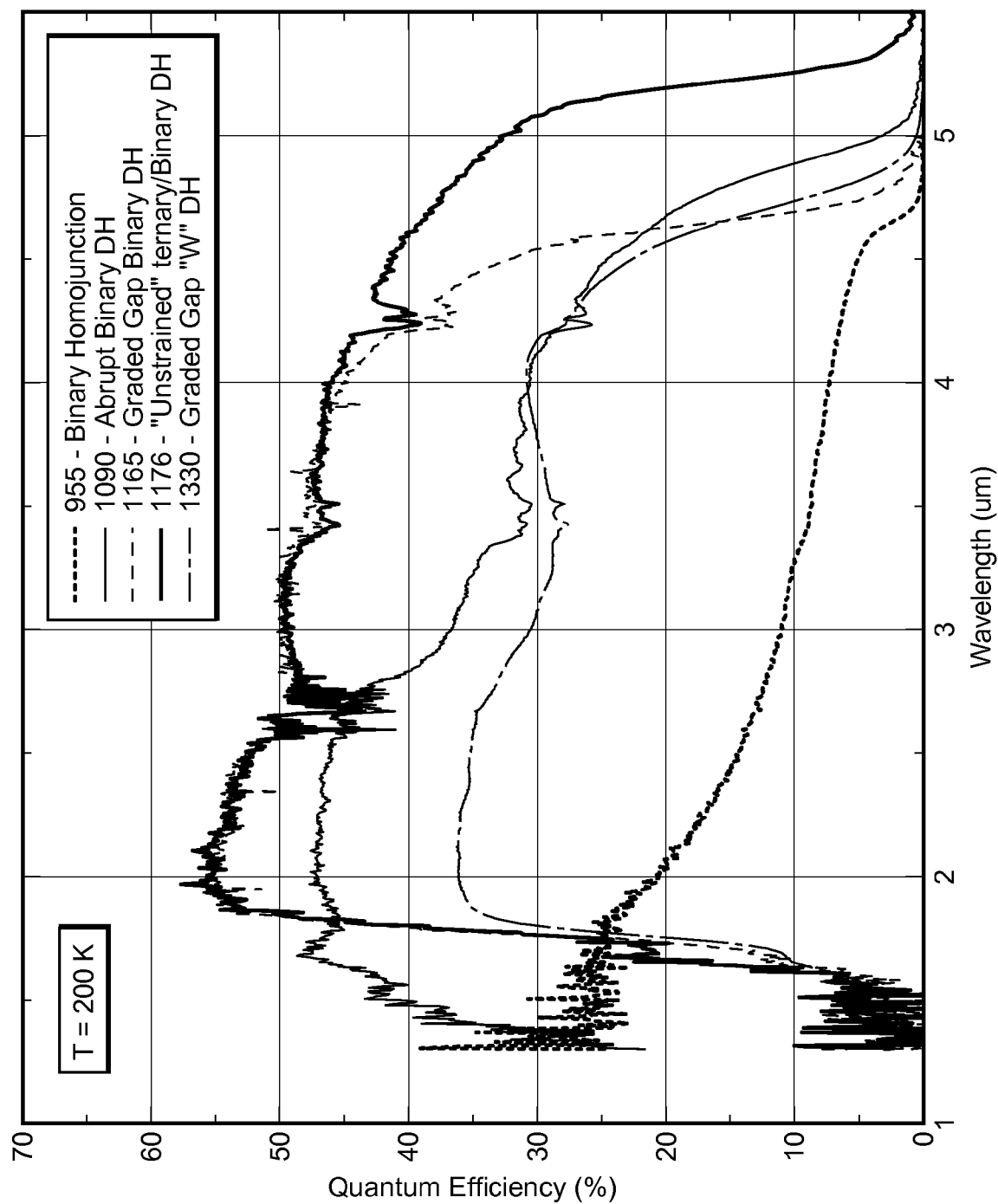
FIG. 4 is a graph showing quantum efficiency (QE) measured at 200 K for the various IR detector designs shown in FIG. 2.

Various SL materials were fabricated into MWIR detectors and tested; a set of results is shown in FIG. 3, which depicts current-voltage (I-V) curves at a temperature of 200 K for an SL structure as described herein ("unstrained" ternary/binary SL DH (Double Heterostructure)), along with binary/binary and W-type SLS designs, including variations with and without a heterostructure of wide bandgap material surrounding the absorber to reduce junction-related G-R and surface-related dark currents. Rule-07 and the Auger-limited "SLS Goal" for binary/binary SLS are also shown for comparison. These results illustrate that the newly developed ternary/binary structure already provides performance comparable to that of the well-developed graded gap binary structure, and would perform even better if the heterojunctions were graded as discussed above. Quantum efficiency (QE), which represents a calibrated standard for response/sensitivity of the detector to incoming light, is illustrated in FIG. 4 for the same detectors. All layers were approximately 4 microns thick except for #955 and #1090 which were 2 microns thick. All samples were also measured with the substrate in place (not removed) and no anti-reflection coating. Sample #1330 did not have a reflecting contact applied so the QE appears lower than the others since there was no second pass of the light through the detector. From this, it can be seen that the Unstrained GaSb/InAsSb SL device has the highest QE for the thickness and taking into account the narrower bandgap (longer cutoff).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A superlattice structure, comprising:
a layer comprising InAsSb; and
a layer comprising GaSb adjacent to said InAsSb layer;
said adjacent InAsSb and GaSb layers repeating to form a superlattice structure, the composition of said InAsSb layer such that said superlattice structure is an unstrained superlattice structure.

2. The superlattice structure of claim 1, wherein the composition of said InAsSb layer is $InAs_{0.91}Sb_{0.09}$.

3. The superlattice structure of claim 2, wherein said $InAs_{0.91}Sb_{0.09}$ layers are lattice-matched to said GaSb layers.

4. The superlattice structure of claim 2, wherein the thicknesses of said layers are 4 Monolayers $InAs_{0.91}Sb_{0.09}$ and 10 Monolayers GaSb, respectively.

5. The superlattice structure of claim 1, wherein said superlattice structure forms at least a portion of an infrared photodetector.

6. The superlattice structure of claim 1, wherein said InAsSb layer is a first layer and said GaSb layer is a second layer on said first layer, said first and second layers repeating to form said superlattice structure.

7. The superlattice structure of claim 1, wherein said GaSb layer is a first layer and said InAsSb layer is a second layer on said first layer, said first and second layers repeating to form said superlattice structure.

8. The superlattice structure of claim 1, wherein said Sb component of said InAsSb layers is such that the strain in said superlattice structure is less than that found in an InAs/GaSb Type-II Strained Layer Superlattice (SLS).

9. The superlattice structure of claim 1, further comprising a substrate layer, said superlattice structure directly on said substrate layer.

10. The superlattice structure of claim 9, wherein said substrate layer comprises GaSb.

* * * * *